(12) United States Patent
Zheng et al.

(10) Patent No.: US 9,917,211 B2
(45) Date of Patent: Mar. 13, 2018

(54) FLASH MEMORY CELLS HAVING TRENCHED STORAGE ELEMENTS

(71) Applicant: Spansion LLC, Sunnyvale, CA (US)

(72) Inventors: Wei Zheng, Santa Clara, CA (US); Chi Chang, Saratoga, CA (US); Unsoon Kim, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/254,237

(22) Filed: Apr. 16, 2014

(65) Prior Publication Data

US 2014/0225177 A1    Aug. 14, 2014

Related U.S. Application Data

(62) Division of application No. 11/702,846, filed on Feb. 5, 2007, now Pat. No. 8,742,486.

(60) Provisional application No. 60/765,111, filed on Feb. 4, 2006.

(51) Int. Cl.

| H01L 21/28 | (2006.01) |
|---|---|
| H01L 29/792 | (2006.01) |
| H01L 21/8234 | (2006.01) |
| H01L 27/115 | (2017.01) |
| H01L 27/11568 | (2017.01) |
| H01L 29/66 | (2006.01) |

(52) U.S. Cl.
CPC .... *H01L 29/792* (2013.01); *H01L 21/823418* (2013.01); *H01L 27/115* (2013.01); *H01L 27/11568* (2013.01); *H01L 29/66833* (2013.01); *H01L 29/7923* (2013.01)

(58) Field of Classification Search
CPC ............... H01L 29/792; H01L 27/1156; H01L 21/823418; H01L 21/28282
USPC ......................................... 438/287
See application file for complete search history.

(56) References Cited

U.S. PATENT DOCUMENTS

| 5,510,638 | A | 4/1996 | Lancaster et al. | |
|---|---|---|---|---|
| 5,969,383 | A | 10/1999 | Chang et al. | |
| 6,969,383 | B2 | 11/2005 | Hildebrand | |
| 2002/0054512 | A1* | 5/2002 | Miida | 365/185.28 |
| 2005/0259475 | A1 | 11/2005 | Forbes | |
| 2006/0043457 | A1 | 3/2006 | Baik | |
| 2006/0223267 | A1* | 10/2006 | Machill et al. | 438/288 |

OTHER PUBLICATIONS

USPTO Advisory Action for U.S. Appl. No. 11/702,846 dated Jun. 11, 2010; 3 pages.
USPTO Final Rejection for U.S. Appl. No. 11/702,846 dated Feb. 06, 2012; 11 pages.

(Continued)

*Primary Examiner* — Tran Tran
(74) *Attorney, Agent, or Firm* — Lowenstein Sandler LLP (57) ABSTRACT

An embodiment of the present invention is directed to a memory cell. The memory cell includes a first trench formed in a semiconductor substrate and a second trench formed in said semiconductor substrate adjacent to said first trench. The first trench and the second trench each define a first side wall and a second sidewall respectively. The memory cell further includes a first storage element formed on the first sidewall of the first trench and a second storage element formed on the second sidewall of the second trench.

8 Claims, 10 Drawing Sheets

(56) References Cited

OTHER PUBLICATIONS

USPTO Final Rejection for U.S. Appl. No. 11/702,846 dated Mar. 02, 2010; 10 pages.
USPTO Final Rejection for U.S. Appl. No. 11/702,846 dated Apr. 26, 2011; 14 pages.
USPTO Final Rejection for U.S. Appl. No. 11/702,846 dated Jul. 21, 2010; 13 pages.
USPTO Final Rejection for U.S. Appl. No. 11/702,846 dated Jul. 22, 2013; 10 pages.
USPTO Final Rejection for U.S. Appl. No. 11/702,846 dated Oct. 23, 2012; 11 pages.
USPTO Final Rejection for U.S. Appl. No. 11/702,846 dated Oct. 29, 2009; 8 pages.
USPTO Non-Final Rejection for U.S. Appl. No. 11/7002,846 dated Oct. 23, 2008; 9 pages.
USPTO Non-Final Rejection for U.S. Appl. No. 11/702,846 dated Feb. 8, 2013; 10 pages.
USPTO Non-Final Rejection for U.S. Appl. No. 11/702,846 dated May 11, 2009; 7 pages.
USPTO Non-Final Rejection for U.S. Appl. No. 11/702,846 dated May 16, 2012; 10 pages.
USPTO Non-Final Rejection for U.S. Appl. No. 11/702,846 dated Aug. 26, 2011; 13 pages.
USPTO Non-Final Rejection for U.S. Appl. No. 11/702,846 dated Nov. 15, 2010; 13 pages.
USPTO Notice of Allowance for U.S. Appl. No. 11/702,846 dated Jan. 15, 2014; 7 pages.

* cited by examiner

FLASH MEMORY CELLS HAVING TRENCHED STORAGE ELEMENTS

CLAIM OF PRIORITY UNDER 35 U.S.C. §119

This application is a Divisional Application of U.S. patent application Ser. No. 11/702,846 entitled "FLASH MEMORY CELLS HAVING TRENCHED STORAGE ELEMENTS," filed Feb. 5, 2007, which claims priority to U.S. Provisional Patent Application No. 60/765,111 entitled "APPARATUS AND METHOD FOR FABRICATING FLASH MEMORY CELLS HAVING TRENCHED STORAGE ELEMENTS," filed Feb. 4, 2006, and assigned to the assignee hereof and are hereby both expressly incorporated by reference herein.

BACKGROUND

1. Field

Embodiments of the present invention generally relate to the field of semiconductor devices. More particularly, embodiments relate to memory storage cells.

2. Background

In recent years, dual bit memory cells, such as those employing MirrorBit® technology developed by Spansion, Inc., have been developed. As the name suggests, dual bit memory cells double the intrinsic density of a flash memory array by storing two physically distinct bits on opposite sides of a memory cell. Ideally, reading or programming one side of a memory cell occurs independently of whatever data is stored on the opposite side of the cell.

Figure 1A:
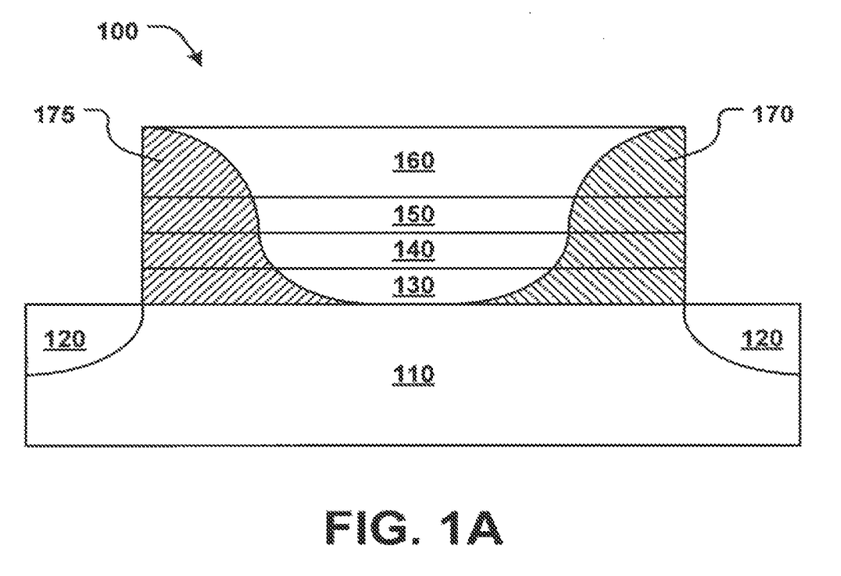
FIG. 1A illustrates a conventional dual-bit memory cell.

FIG. 1A illustrates a conventional dual-bit memory cell 100. Conventional dual bit memory cell 100 typically includes a substrate 110 with source/drain regions 120 implanted therein, a first oxide layer 130 above the substrate 110, a continuous charge trapping layer 140, a second oxide layer 150, and a poly layer 160. The bottom oxide layer 130 is also commonly referred to as a tunnel oxide layer.

Programming of a dual bit memory cell 100 can be accomplished, for example, by hot electron injection. Hot electron injection involves applying appropriate voltage potentials to the gate, source, and drain of the cell 100 for a specified duration until the charge trapping layer 140 accumulates charge. While for simplicity, charge is typically thought of as being stored in a fixed location (i.e., the edges) of charge trapping layer 140, in reality the location of the trapped charge for each node falls under a probability curve, such as curves 170 and 175. For the purposes of this discussion the bit associated with curve 170 shall be referred to as the "normal bit" and the bit associated with curve 175 shall be referred to as the "complementary bit". It should be appreciated from FIG. 1A that the memory cell 100 illustrated therein is reasonably large, such that the two charge storage nodes can be fairly localized and well separated.

Figure 1B:
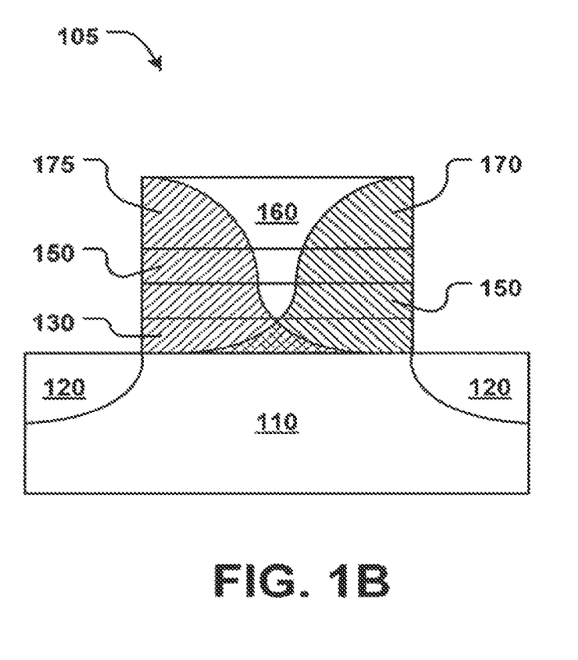
FIG. 1B illustrates a conventional dual bit memory cell having a smaller process geometry than the memory cell of FIG. 1A.

FIG. 1B illustrates a conventional dual bit memory cell 105 having a smaller process geometry than the memory cell 100 of FIG. 1A. FIG. 1B illustrates that as the cell gets smaller, the distribution curves 170 and 175 stay the same, resulting in an overlap of the curves 170 and 175. Such an overlap in these regions can result in the contamination of one bit by its neighboring bit. This is also known as complementary bit disturb or program disturb.

Figure 2:
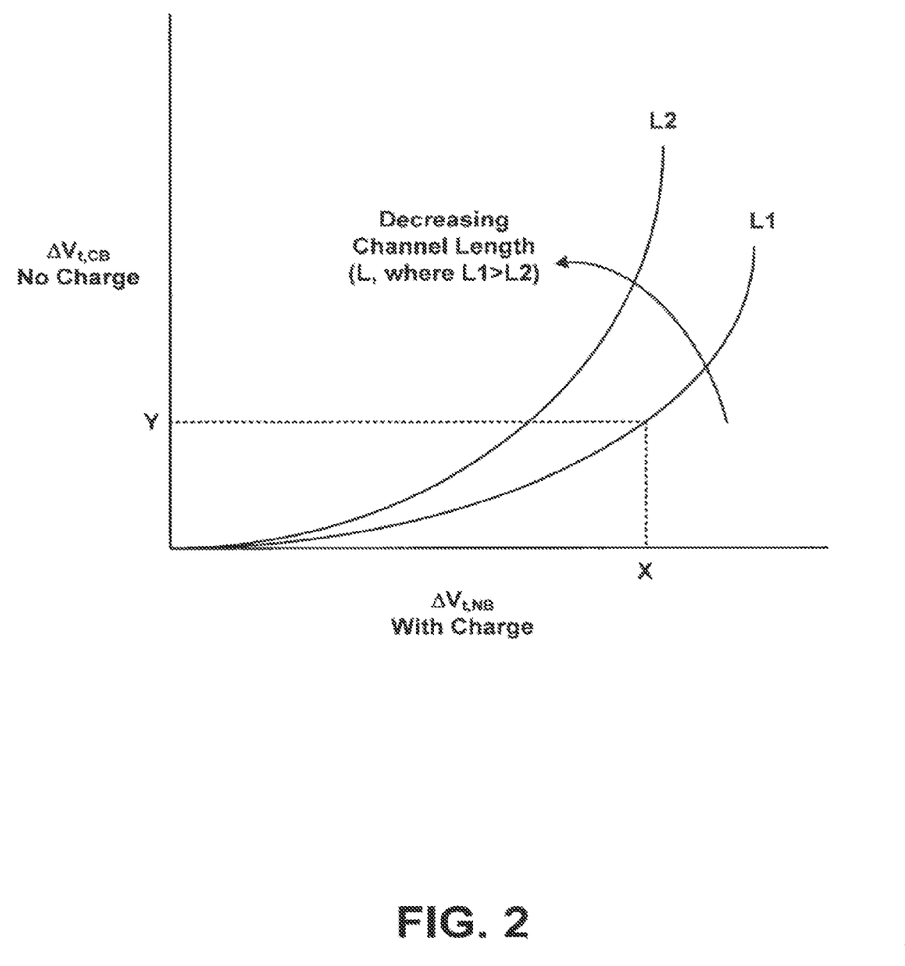
FIG. 2 graphically illustrates complementary bit disturb in a conventional memory cell having a continuous charge trapping layer.

FIG. 2 graphically illustrates complementary bit disturb in a conventional memory cell having a continuous charge trapping layer. FIG. 2 illustrates the example of when the normal bit has been programmed, but the complementary bit has not. In such a case, the normal bit should read "0" and the complementary bit should read "1". Whether or not a bit is programmed is reflected by a delta in the threshold voltage associated with that bit. In conventional dual bit memory cells, programming of a normal bit also results in a shift of the $V_t$ of the complementary bit. For example, in a memory cell having a channel length L1, changing the $V_t$ of the normal bit by X results in a change of the $V_t$ of the complementary bit of Y. As the cell size gets smaller, resulting in a shorter channel length (e.g., L2), the disturbance increases, even before the bits physically touch each other. Thus, conventional dual bit memory cells do not have adequate protection against physical contamination of one bit by its neighboring bit, as well as protection against program disturb in general.

Erasure of a dual bit memory cell can be accomplished using, for example, the conventional technique of "hot hole injection" (sometimes referred to as band-to-band (BTB) hot hole injection). In hot hole injection, appropriate voltages are applied to the gate and a drain, while the source is floated or grounded, to erase one of the memory cells (typically the normal bit). Conversely, the complementary bit cell is erased by floating the drain and applying the appropriate voltages to the source and the gate. With such erase conditions, a BTB tunnel current is created under the gate. Holes are generated under these conditions and accelerate from the n-type drain region into the p-type substrate. The generated holes are accelerated in the electrical field created near the P-N drain/body junction. Some of the accelerated holes surmount the oxide-to-silicon interface between the substrate and the bottom oxide and are injected into the nitride layer to displace electrons (e.g., by recombination) and erase the cell. However, as these hot holes bombard the interface between the substrate and the bottom oxide, the interface, as well as the bottom oxide, is damaged causing undesirable interface states and degraded reliability over program/erase cycling.

Another erase mechanism is channel erase, also commonly referred to as a Fowler-Nordheim (FN) erase operation. Typically, in conventional dual bit memory cells, the top and bottom oxide have the same and dielectric constant, resulting in the vertical fields during erase being the same across both the top and bottom oxides. Therefore, during an FN channel erase, electrons are pushed out from the charge restoring layer to the substrate. At the same time, more electrons flow from the N+ gate through the top oxide and get trapped in the charge storing layer. Therefore while there is a net current from the control gate to the substrate, charge is not erased effectively from the charge storing layer.

In addition to the specific issues related to dual bit memory cells, decreasing memory cell channel length in general also raises several other issues, commonly referred to as the "short channel effect." For instance, short channel effect may refer to source/drain leakage issues, loss of gate control issues, etc.

SUMMARY

An embodiment of the present invention is directed to a memory cell. The memory cell includes a first trench formed in a semiconductor substrate and a second trench formed in said semiconductor substrate adjacent to said first trench. The first trench and the second trench each define a first side wall and a second sidewall respectively. The memory cell further includes a first storage element formed on the first sidewall of the first trench and a second storage element formed on the second sidewall of the second trench.

Thus, embodiments provide for dual storage node memory cells with physical separation of the storage nodes by an insulator. Such separation of the storage nodes greatly reduces program disturb between the two storage nodes, which is a critical issue as process geometries continue to decrease.

Notwithstanding these improvements, embodiments also provide for a memory cell having a longer channel length then a conventional memory cell of similar cell size. Thus, the short channel effect is reduced even more.

Additionally, embodiments offer improved programming performance. For example, the unique channel geometry exhibited by some embodiments may help the channel with hot electron injection programming efficiency. Therefore, the programming speed may be improved. Furthermore, with the use of certain materials as the charge storage layer, charges may be removed more efficiently from the charge storage element. Therefore, the Fowler-Nordheim (FN) erase method can be more readily used, resulting in improved reliability. Moreover, embodiments are able to use a thinner gate oxide, which results in further improvements with respect to short channel effect and improved gate control.

DETAILED DESCRIPTION

The present invention will now be described in detail with reference to a various embodiments thereof as illustrated in the accompanying drawings. In the following description, specific details are set forth in order to provide a thorough understanding of the present invention. It will be apparent, however, to one skilled in the art, that the present invention may be practiced without using some of the implementation details set forth herein. It should also be understood that well known operations have not been described in detail in order to not unnecessarily obscure the present invention.

Briefly stated, embodiments reduce the likelihood of program disturb in a dual bit memory cell through physical separation of the charge storage nodes by forming separate charge storage nodes in trenches of a substrate, thereby preventing charge contamination between the storage nodes. Because two separate charge storage regions are used, rather than one continuous charge storage layer, the separate charge storage nodes are insulated from each other. Embodiments also achieve an overall reduction in cell size without sacrificing channel length. Furthermore, embodiments allow for the formation of a thinner gate oxide than in conventional cells.

Exemplary Memory Cell in Accordance with an Embodiment

Figure 3:
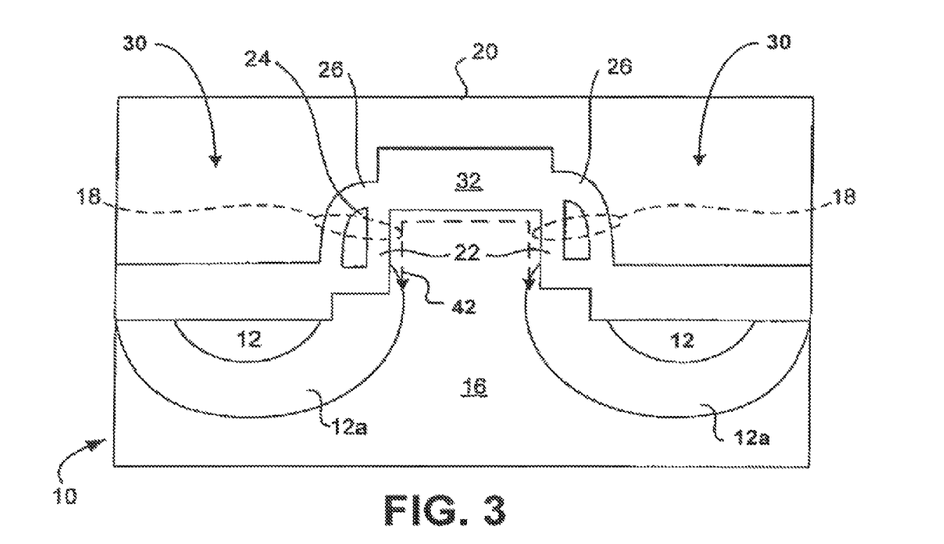
FIG. 3 illustrates a cross-sectional view of an exemplary semiconductor device, in accordance with various embodiments of the present invention.

FIG. 3 illustrates a cross-sectional view of a memory cell 10, in accordance with various embodiments of the present invention. The memory cell 10 includes a silicon substrate 16 having trenches 30 etched therein. The substrate 16 may be either P or N type doped silicon. The memory cell 10 also includes two source/drain regions 12a formed substantially under the trenches 30 in the silicon substrate 16. The source/drain regions 12a will serve as bit lines for the memory cell 10.

The memory cell 10 also includes two storage elements 18 formed along sidewalls of the trenches 30. In one embodiment, the storage elements 18 are substantially vertical within the memory cell 10. The storage elements 18 each include a first oxide layer 22, a charge storage layer 24, and a second oxide layer 26. In one embodiment, the first oxide layer 22, the charge storage layer 24, and the second oxide layer 26 have respective thicknesses of 30 to 100 angstroms, 40 to 150 angstroms, and 40 to 250 angstroms. In other embodiments, other respective thicknesses may be employed.

In various embodiments, the charge storage layer 24 may include, but is not limited to, silicon nitride (SiN), silicon rich nitride (SiRN), polysilicon, or high-K materials. It should be appreciated by one of skill in the art that although polysilicon and nitride materials may be used, the properties of the two materials are very different. For example, polysilicon is a conductor, which means that an electron may freely move throughout the material. By contrast, nitrides such as SiN and SiRN are insulators, wherein the location of a given electron stays relatively constant.

An oxide layer 32 is also provided between the storage elements 18 to serve as a contact with the word line 20. In one embodiment, the word line 20 comprises polysilicon. Because the memory cell 10 does not have a continuous charge storage layer, the oxide layer 32 across the top may be much thinner than in conventional memory cells, such as those utilizing a continuous ONO gate stack. Having a thinner gate oxide layer 32 allows for improved short channel effect and improved gate control for the memory cell 10.

The memory cell 10 also has a channel, which is approximated by dashed arrow 42. As a result of the trenching, the channel 42 takes on an inverted "U" shape along the surface of the substrate 16. In other words, the channel borrows some length from the vertical direction. As a result of this unique shape, embodiments are able to achieve a longer channel length for a given size of memory cell than a conventional memory cell of the same size. Furthermore, this channel geometry may help the channel with hot electron injection programming efficiency. For example, the programming speed may be improved. Moreover, with the use of the silicon a rich nitride or polysilicon as the charge storage layer 24, charges can be removed more efficiently from the charge storage elements 18. Thus, FN erase can be more readily used, resulting in improved reliability.

With reference to FIGS. 4A-4E, a series of gross sections illustrating the process flow steps for making the flash memory cell 10 is shown.

Figure 4A:
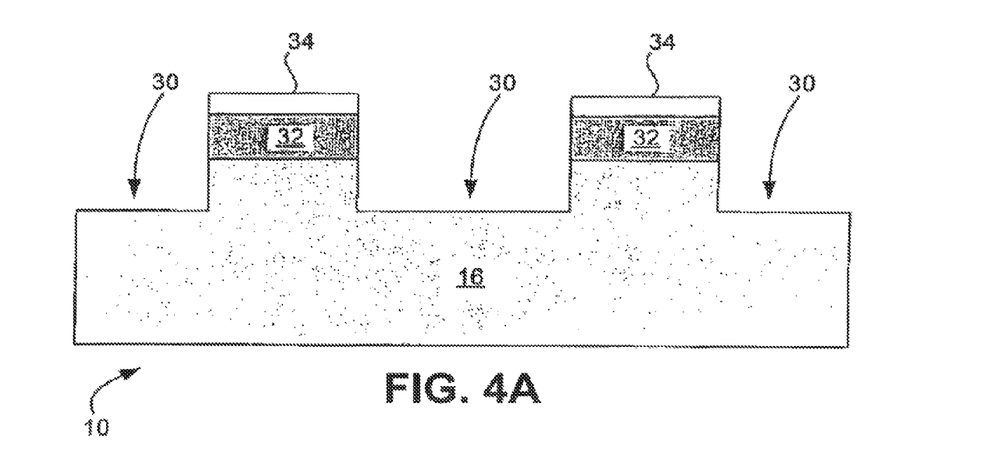
FIGS. 4A-4E are a series of cross sections illustrating a semiconductor process flow for manufacturing a flash memory cell, in accordance with various embodiments of the present invention.

As shown in FIG. 4A, trenches 30 are formed in a silicon substrate 16. The trenches 30 may be formed using any well-known semiconductor fabrication technique. For example, the trenches 30 may be formed by wet or dry etch. The wet etch may be a diluted HF etch, a chemical oxide removal (COR) etch, or the like. In one embodiment, an oxide layer 32 and a hard mask 34 formed on the surface of the substrate 16. It should be appreciated that the hard mask 16 may be a number of materials, including silicon nitride and the like. The hard mask is then patterned and removed in the locations where the trenches 30 are to be formed. The device 10 is then subject to a silicon etch, which forms the trenches 30. In various embodiments, the trench depth may range from 100 to 1000 angstroms. In other embodiments, other trench depths may be employed.

Figure 4B:
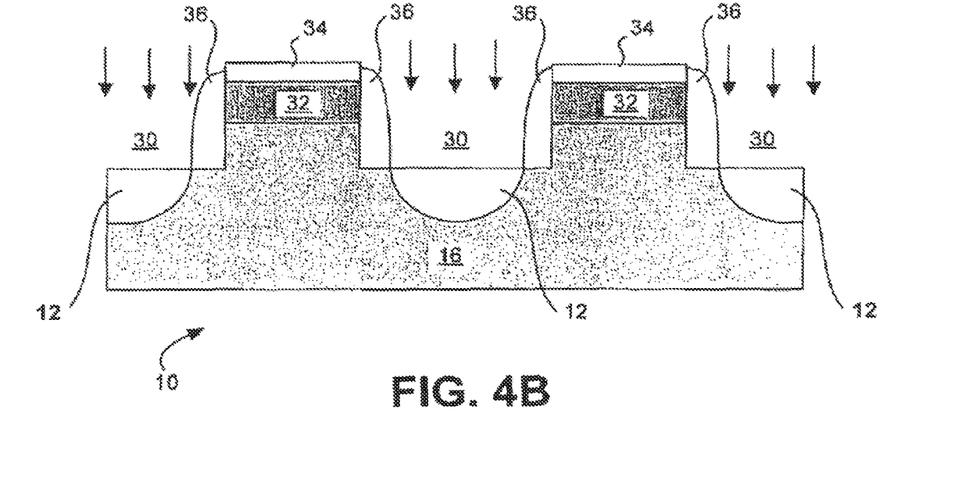

As shown in FIG. 4B, the source/drain regions 12 (i.e., bit lines) are formed. In one embodiment, the source/drain regions 12 are formed by first forming sacrificial offset spacers 36 on the sidewalls of the oxide layer 32. Once the offset spacers 36 are created, an implant is performed, as designated by the arrows in FIG. 4B, creating the source/drain implant regions 12. In one embodiment, an N+ material such as arsenic is implanted into the substrate 16. In another embodiment, a P+ material such as boron may be implanted after the source/drain regions 12 are formed, the offset spacers 36 are removed by either a wet or dry etch.

Figure 4C:
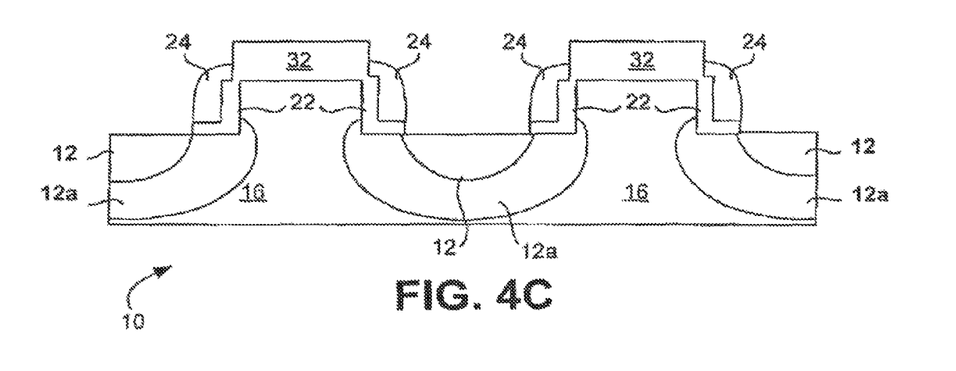

Referring to FIG. 4C, the first oxide layer 22 and the charge storage layer 24 of the storage elements 18 are formed. Initially, the hard mask 34 may be removed. This may be accomplished by a chemical mechanical processing (CMP) polish, for example. An oxide layer is then formed on the substrate 16 to form the first oxide layer 22. As stated above, the first oxide layer 22 may have a thickness ranging from 30 to 100 angstroms. It should be appreciated that the oxide layer 22 may be formed in a number of ways, including thermal oxidation, Chemical Vapor Deposition (CVD), and the like. It should be further appreciated that during a thermal oxidation, the implanted material in the source/drain regions 12 diffuses, forming the larger source/drain regions 12a. The charge storage layer 24 is then formed. The charge storage layer 24 may include, but is not limited to, silicon nitride, silicon rich nitride, polycrystalline silicon, and high-K material. In one embodiment, a layer of charge storage material may be deposited on the surface of the substrate 16 and then patterned with a dry etch process to form the spacer-shaped structures on the sidewalls of the trenches 30 illustrated in FIG. 4C. In another embodiment, the first oxide layer 22 may be etched in a separate earlier etch or at the same time as the etch of the charge storage layer 24. As stated above, the thickness of the charge storage layer 24 may range from 40 to 150 angstroms.

Figure 4D:
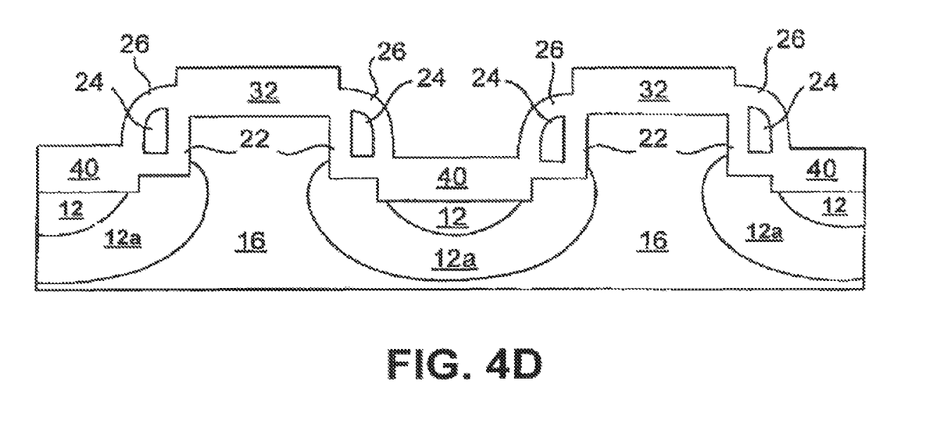

As shown in FIG. 4D, the second oxide layer 26 of the storage elements 18 is formed. It should be appreciated that the oxide layer 26 may be formed in a number of ways. For example, the oxide layer 26 may be thermally grown or grown with plasma oxidation. In other embodiments, the oxide layer 26 is formed with a combination of oxide growth and a deposition process. As stated above, the thickness of the second oxide layer 26 may range from 40 to 250 angstroms. During the formation of the second oxide layer 26, an oxide layer 40 is also formed on the substrate 16 over the diffused source/drain regions 12a.

Figure 4E:
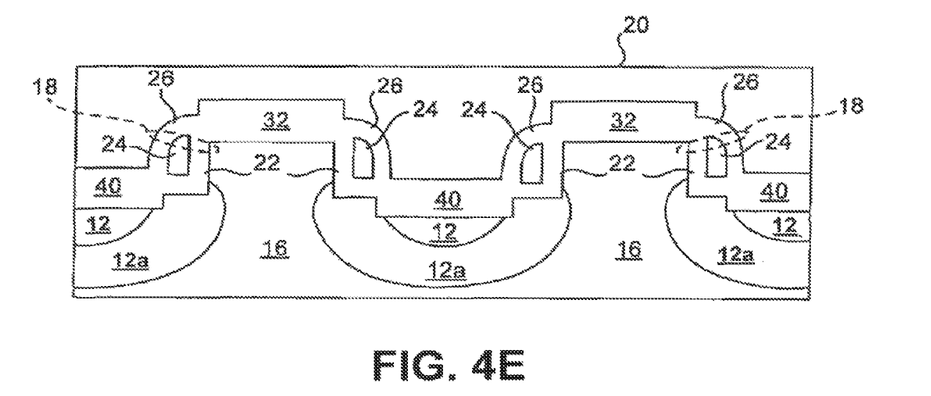

Referring to FIG. 4E, the word line 20 is formed. In one embodiment, this is accomplished by depositing a layer of polysilicon onto the substrate 16 and then etching and patterning the polysilicon to form the individual word lines 20 running across the substrate 16.

Figure 5:
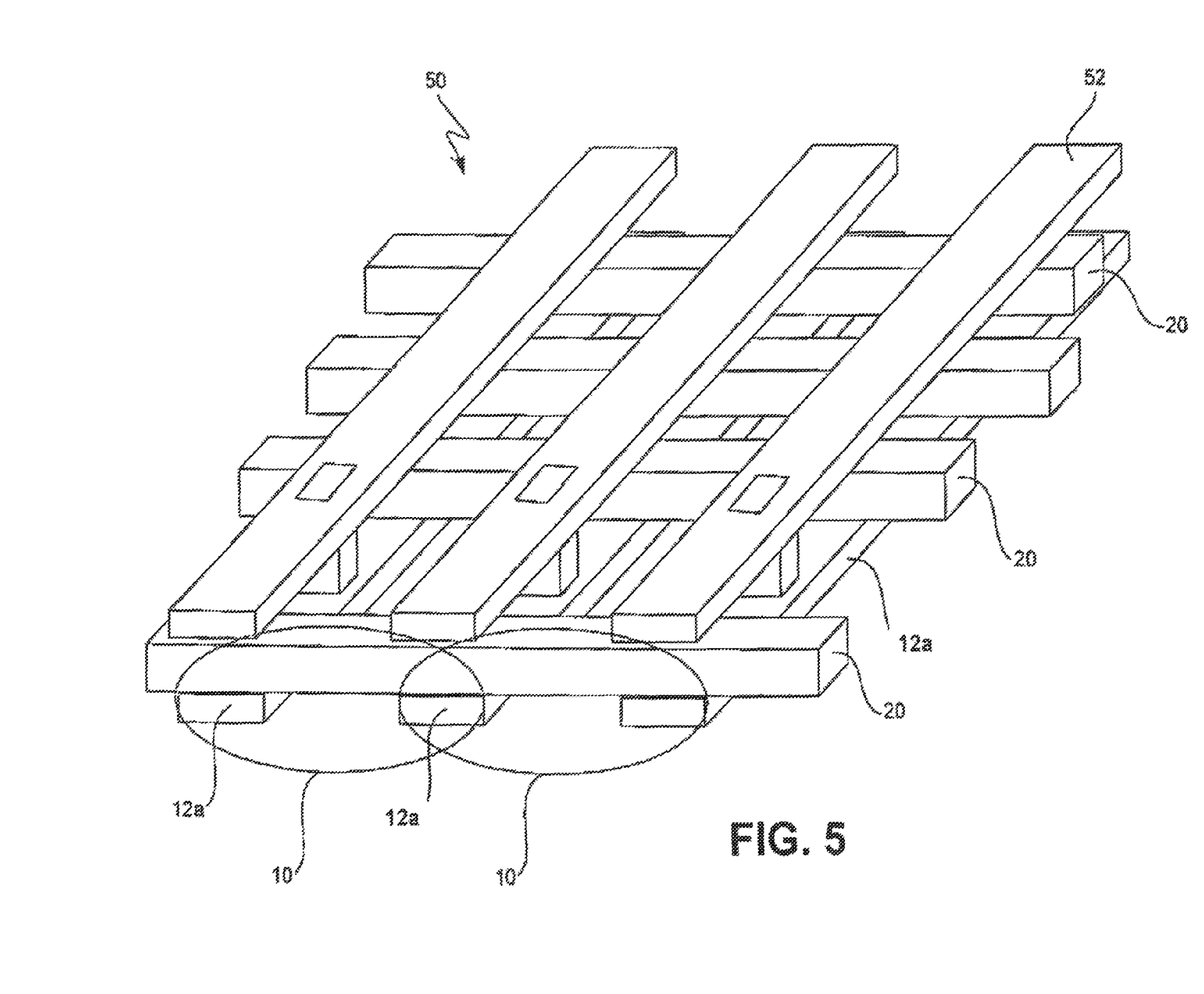
FIG. 5 is an array architecture using flash memory cells, in accordance with various embodiments of the present invention.

FIG. 5 illustrates an array architecture and 50 using flash memory cells 10, in accordance with various embodiments of the present invention. The array 50 includes a plurality of the word lines 20 running in one direction and a plurality of overlying metal interconnects 52 running in the perpendicular direction. The metal interconnects 52 deliver voltage to the underlying source/drain regions 12 through metal interconnects 53. FIG. 5 shows two adjacent cells 10, labeled "cell 1" and "cell 2." The two cells 10 share a common source/drain region 12. The cells 10 according to embodiments of the present invention can be substituted in place of the aforementioned planar cell currently used in the MirrorBit® technology mentioned above, and described in detail in U.S. Pat. Nos. and Publications 6,861,307, 6,917,068, 6,639,271, 6,215,702, and 2004/0021172, each of which are incorporated by reference herein for all purposes.

Exemplary Methods of Fabrication According to Various Embodiments

Figure 6:
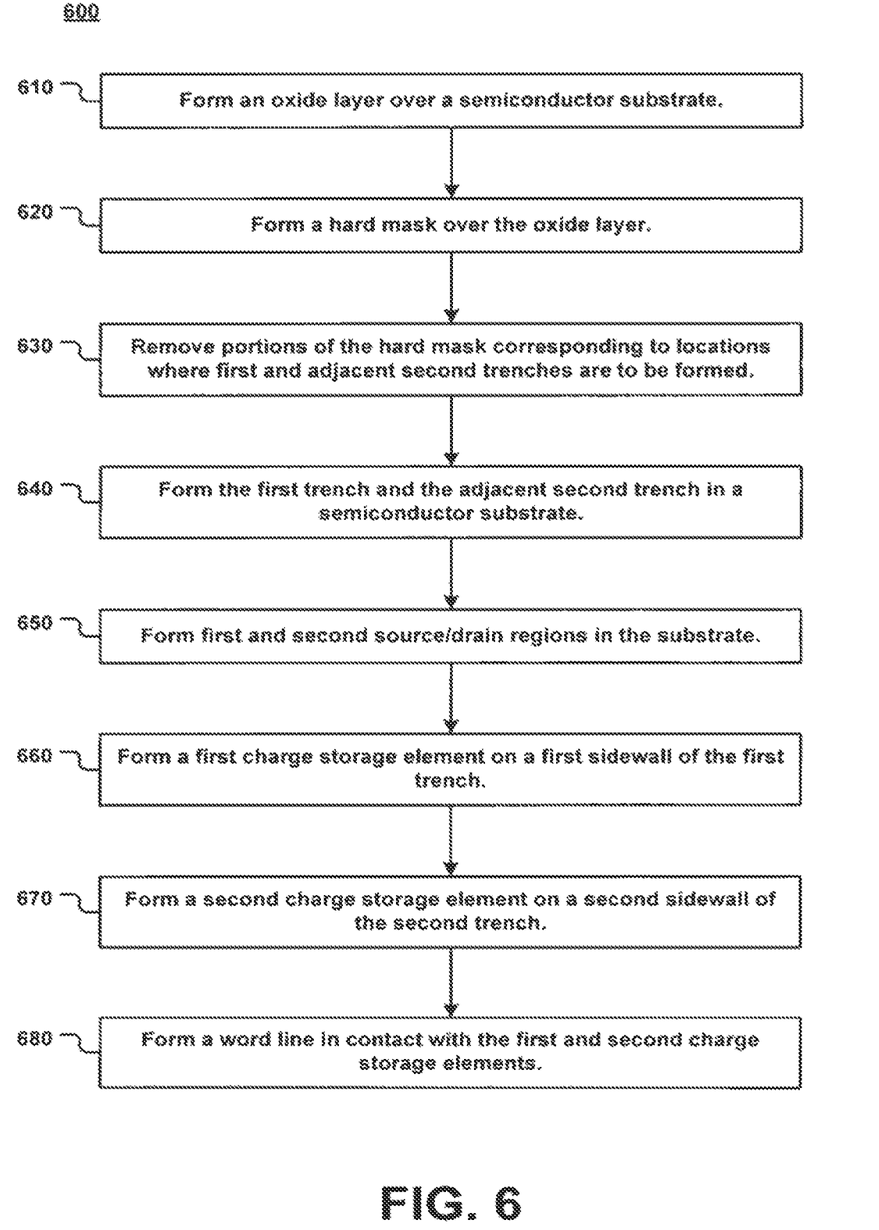
FIG. 6 illustrates a flowchart a process for fabricating a semiconductor memory cell having at least two charge storage elements, in accordance with various embodiments of the present invention.
Figure 7:
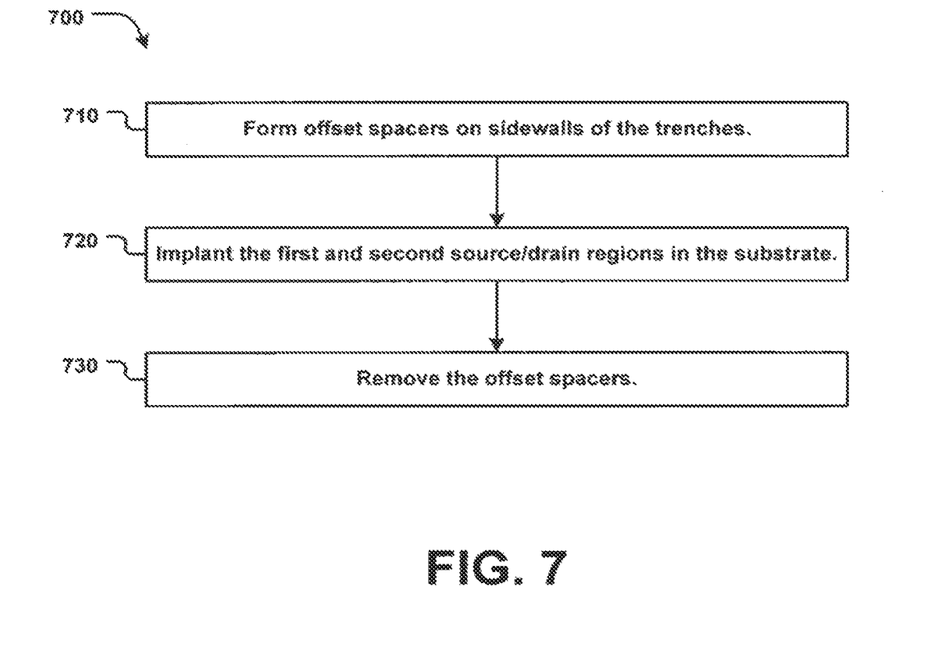
FIG. 7 illustrates a flowchart 700 of a process for forming a source/drain region, in accordance with various embodiments of the present invention.
Figure 8:
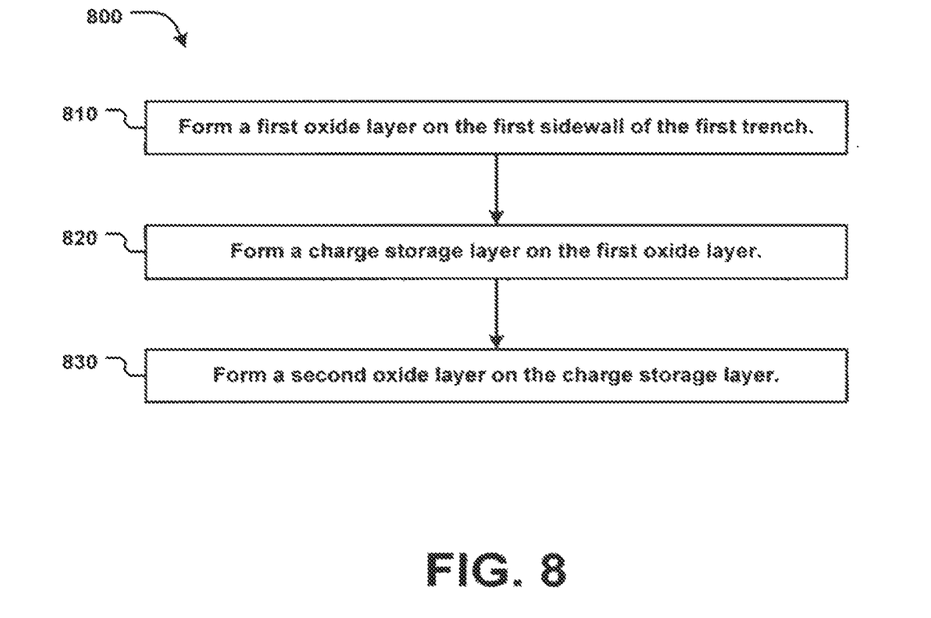
FIG. 8 illustrates a flowchart for a process of forming a charge storage element on a sidewall of a trench, in accordance with various embodiments of the present invention.

The following discussion sets forth in detail processes of fabrication according to various embodiments. With reference to FIGS. 6-8, flowcharts 600, 700, and 800 each illustrate example fabrication steps used and various embodiments. Although specific steps are disclosed in flowcharts 600, 700, and 800, such steps are examples. That is, embodiments are well suited to using various other steps or variations of the steps recited in flowcharts 600, 700, and 800. It is appreciated that the steps in flowcharts 600, 700, and 800 may be performed in an order different than presented, and that not all of the steps in flowcharts 600, 700, and 800 may be performed.

FIG. 6 illustrates a flowchart 600 a process for fabricating a semiconductor memory cell having at least two charge storage elements, in accordance with various embodiments of the present invention. At block 610, and oxide layer 32 is formed over a semiconductor substrate 16. At block 620, a hard mask 34 is formed over the oxide layer. Portions of the hard mask 34 corresponding to locations where trenches are to be formed are then removed (block 630). Block 640 then involves forming trenches 30 in the substrate 16. This may be achieved by a wet or dry etch, for example.

At block 650, source/drain regions 12 are formed in the substrate 16. It should be appreciated that this may be achieved a number of ways. For example, FIG. 7 illustrates a flowchart 700 of a process for forming a source/drain region, in accordance with various embodiments of the present invention. At block 710, offset spacers 36 are formed on sidewalls of the trenches 30. At block 720, the source/drain regions 12 are implanted into the substrate 16. The offset spacers 36 are subsequently removed (block 730).

With reference again to FIG. 6, block 660 involves forming a first charge storage element 18 on a first sidewall of the first trench 30. It should be appreciated that this may be achieved in a number of ways. For example, FIG. 8 illustrates a flowchart 800 for a process of forming a charge storage element 18 on a sidewall of a trench 30, in accordance with various embodiments of the present invention. At block 810, a first oxide layer 22 is formed on the sidewall of the trench 30. At block 820, a charge storage layer 24 is formed on the first oxide layer 22. In various embodiments, the charge storage layer 24 may include, but is not limited to, silicon nitride (SiN), silicon rich nitride (SiRN), poly-silicon, or high-K materials. Next, a second oxide layer 26 is formed on the charge storage layer 24 (block 830).

With reference again to FIG. 6, block 670 involves forming a second charge storage element 18 on a second sidewall of the second trench 30. In one embodiment, the formation of the second charge storage element 18 may be achieved according to flowchart 800, as described above with respect to the first charge storage element. At block 680, a word line 20 is then formed in contact with the first and second charge storage elements 18. This may involve, for example, forming a layer of polysilicon over the charge storage elements 18 and then etching the polysilicon to form the word lines 20.

Exemplary Operating Environments According to One Embodiment

Embodiments generally relate to semiconductor devices. More particularly, embodiments provide for a nonvolatile storage device having a dual bit memory cell with physically separated storage nodes. In one implementation, the various embodiments are applicable to flash memory and devices that utilize flash memory. Flash memory is a form of non-volatile memory that can be electrically erased and reprogrammed. As such, flash memory, in general, is a type of electrically erasable programmable read only memory (EEPROM).

Like Electrically Erasable Programmable Read Only Memory (EEPROM), flash memory is nonvolatile and thus can maintain its contents even without power. However, flash memory is not standard EEPROM. Standard EEPROMs are differentiated from flash memory because they can be erased and reprogrammed on an individual byte or word basis while flash memory can be programmed on a byte or word basis, but is generally erased on a block basis. Although standard EEPROMs may appear to be more versatile, their functionality requires two transistors to hold one bit of data. In contrast, flash memory requires only one transistor to hold one bit of data, which results in a lower cost per bit. As flash memory costs far less than EEPROM, it has become the dominant technology wherever a significant amount of non-volatile, solid-state storage is needed.

Exemplary applications of flash memory include digital audio players, digital cameras, digital video recorders, and mobile phones. Flash memory is also used in USB flash drives, which are used for general storage and transfer of data between computers. Also, flash memory is gaining popularity in the gaming market, where low-cost fast-loading memory in the order of a few hundred megabytes is required, such as in game cartridges. Additionally, flash memory is applicable to cellular handsets, smartphones, personal digital assistants, set-top boxes, digital video recorders, networking and telecommunication equipments, printers, computer peripherals, automotive navigation devices, portable multimedia devices, and gaming systems.

As flash memory is a type of non-volatile memory, it does not need power to maintain the information stored in the chip. In addition, flash memory offers fast read access times and better shock resistance than traditional hard disks. These characteristics explain the popularity of flash memory for applications such as storage on battery-powered devices (e.g., cellular phones, mobile phones, IP phones, wireless phones, etc.). Since flash memory is widely used in such devices, and users would desire the devices to have as large a storage capacity as possible, an increase in memory density would be advantageous. Users would also benefit from reduced memory read time and reduced cost.

Figure 9:
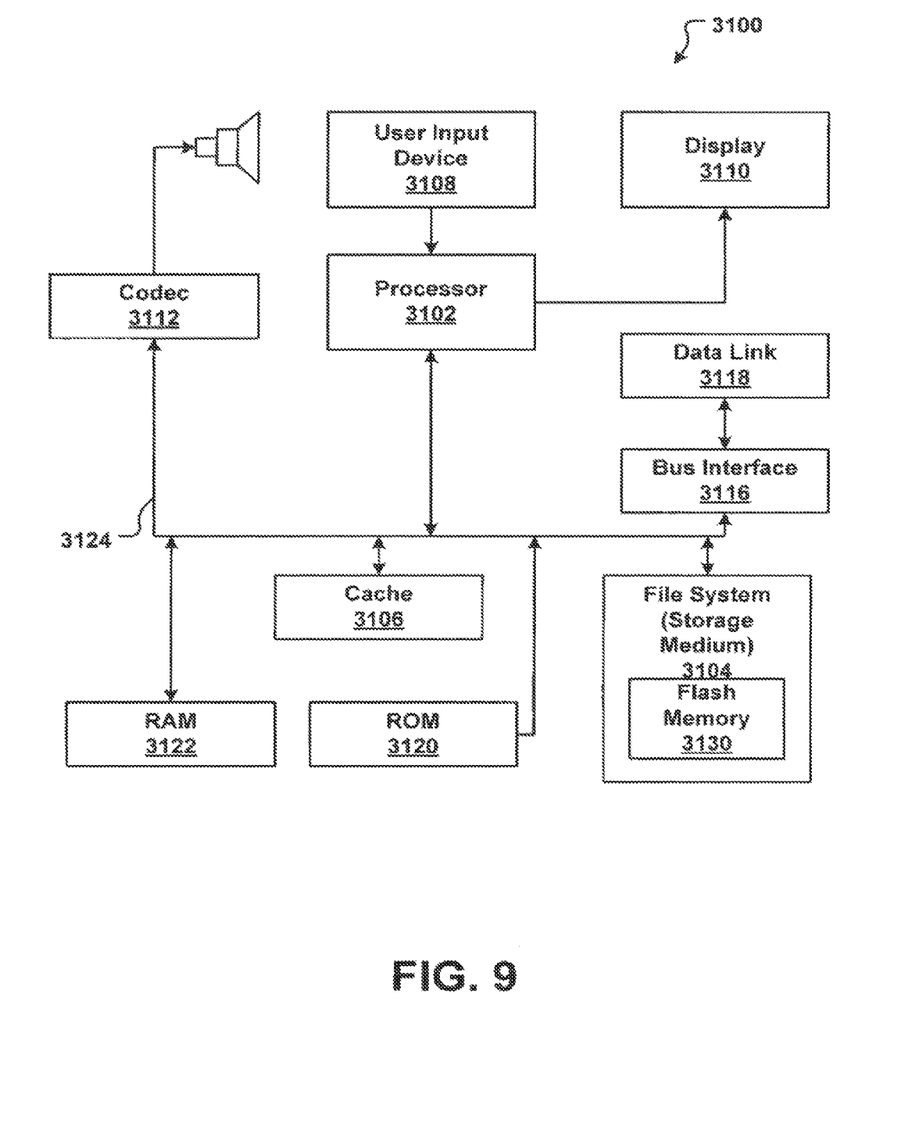
FIG. 9 shows an exemplary operating environment, in accordance with an embodiment of the invention.

FIG. 9 shows an exemplary system 3100 in accordance with an embodiment of the invention. System 3100 is well-suited for a number of applications, including digital audio players, digital cameras, digital video recorders, mobile phones, game cartridges, smartphones, personal digital assistants, set-top boxes, networking and telecommunication equipments, printers, computer peripherals, automotive navigation devices, portable multimedia devices, gaming systems, and the like. The system 3100 includes a processor 3102 that pertains to a microprocessor or controller for controlling the overall operation of the system 3100. The system 3100 also includes flash memory 3130. In the present embodiment, the flash memory 3130 may include: a semiconductor substrate; a first trench formed in said semiconductor substrate; a second trench formed in said semiconductor substrate adjacent to said first trench, said first trench and said second trench each defining a first side wall and a second sidewall respectively; a first source/drain region formed substantially under said first trench in said semiconductor substrate; a second and source/drain region formed substantially under said second trench in said semiconductor substrate; a first storage element formed on said first sidewall of said first trench; and a second storage element formed on said second sidewall of said second trench. The flash memory 3130 may also include other features of a memory cell as described above. According to various embodiments, it is possible to provide a semiconductor device, such as flash memory, such that the memory cells therein each have two physically separated charge storage nodes. As a result, the flash memory 3130 can be manufactured in much smaller packages and much smaller geometries. This decreased size for the flash memory translates into decreased size for various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones.

In the case where the system 3100 is a portable media player, The system 3100 stores media data pertaining to media assets in a file system 3104 and a cache 3106. The file system 3104 is, typically, a storage medium or a plurality of storage media, such as disks, memory cells, and the like. The file system 3104 typically provides high capacity storage capability for the system 3100.

The system 3100 may also include a cache 3106. The cache 3106 is, for example, Random-Access Memory (RAM) provided by semiconductor memory. The relative access time to the cache 3106 is substantially shorter than for the file system 3104. However, the cache 3106 does not have the large storage capacity of the file system 3104. Further, the file system 3104, when active, consumes more power than does the cache 3106. The power consumption is particularly important when the system 3100 is a portable media player that is powered by a battery (not shown). The system 3100 also includes a RAM 3122 and a Read-Only Memory (ROM) 3120. The ROM 3120 can store programs, utilities or processes to be executed in a non-volatile manner. The RAM 3122 provides volatile data storage, such as for the cache 3106.

The system 3100 also includes a user input device 3108 that allows a user of the system 3100 to interact with the system 3100. For example, the user input device 3108 can take a variety of forms, such as a button, keypad, dial, etc. Still further, the system 3100 includes a display 3110 (screen display) that can be controlled by the processor 3102 to display information to the user. A data bus 3124 can facilitate data transfer between at least the file system 3104, the cache 3106, the processor 3102, and the CODEC 3112. The system 3100 also includes a bus interface 3116 that couples to a data link 3118. The data link 3118 allows the system 3100 to couple to a host computer.

In one embodiment, the system 3100 serves to store a plurality of media assets (e.g., songs, photos, video, etc.) in the file system 3104. When a user desires to have the media player play/display a particular media item, a list of available media assets is displayed on the display 3110. Then, using the user input device 3108, a user can select one of the available media assets. The processor 3102, upon receiving a selection of a particular media item, supplies the media data (e.g., audio file, graphic file, video file, etc.) for the particular media item to a coder/decoder (CODEC) 3110. The CODEC 3110 then produces analog output signals for a speaker 3114 or a display 3110. The speaker 3114 can be a speaker internal to the system 3100 or external to the system 3100. For example, headphones or earphones that connect to the system 3100 would be considered an external speaker.

In a particular embodiment, the available media assets are arranged in a hierarchical manner based upon a selected number and type of groupings appropriate to the available media assets. For example, in the case where the system 3100 is an MP3-type media player, the available media assets take the form of MP3 files (each of which corresponds to a digitally encoded song or other audio rendition) stored at least in part in the file system 3104. The available media assets (or in this case, songs) can be grouped in any manner deemed appropriate. In one arrangement, the songs can be arranged hierarchically as a list of music genres at a first level, a list of artists associated with each genre at a second level, a list of albums for each artist listed in the second level at a third level, while at a fourth level a list of songs for each album listed in the third level, and so on. It is to be understood that the present invention is not limited in its application to the above-described embodiments. Needless to say, various modifications and variations of the present invention may be made without departing from the spirit and scope of the present invention.

Also, as mentioned above, flash memory is applicable to a variety of devices other than portable media devices. For instance, flash memory can be utilized in personal digital assistants, set-top boxes, digital video recorders, networking and telecommunication equipments, printers, computer peripherals, automotive navigation devices, and gaming systems.

Figure 10:
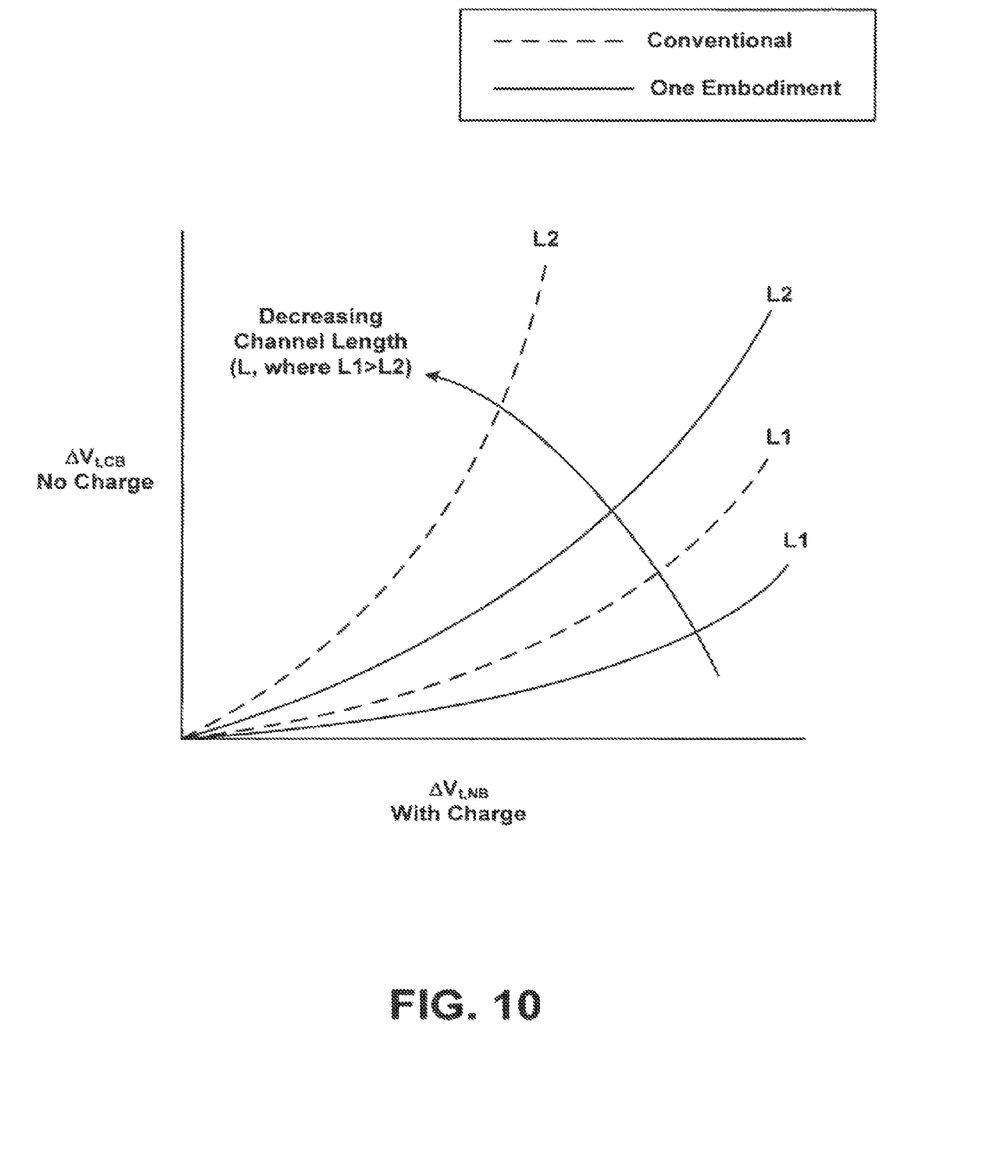
FIG. 10 illustrates advantages of memory cells according to one embodiment over conventional memory cell designs.

FIG. 10 illustrates advantages of memory cells according to one embodiment (solid line) over conventional memory cell designs (dashed line). As shown in FIG. 7, for a given channel length (e.g., L1), the effect of program disturb in embodiments is much less than in conventional designs. Moreover, the effect of decreasing channel length (e.g., L2 vs. L1) is less significant with respect to the embodiment depicted as compared to conventional designs. Thus, embodiments provide for dual storage node memory cells with physical separation of the storage nodes by an insulator. Such separation of the storage nodes greatly reduces program disturb between the two storage nodes, which is a critical issue as process geometries continue to decrease.

Notwithstanding these improvements, embodiments also provide for a memory cell having a longer channel length than a conventional memory cell of similar cell size. Thus, the short channel effect is reduced even more.

Additionally, embodiments offer improved programming performance. For example, the unique channel geometry exhibited by embodiments may help the channel with hot electron injection programming efficiency. Therefore, the programming speed may be improved. Furthermore, with the use of certain materials as the charge storage layer 24, charges may be removed more efficiently from the charge storage element 18. Therefore, the Fowler-Nordheim (FN) erase method can be more readily used, resulting in improved reliability. Moreover, embodiments are able to use a thinner gate oxide, which results in further improvements with respect to short channel effect and improved gate control.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method of fabricating a semiconductor memory cell having at least two charge storage elements, the method comprising:
    forming a first trench and an adjacent second trench in a semiconductor substrate, said first and second trenches each defining a first sidewall and a second sidewall respectively;
    forming a first charge storage element on said first sidewall of said first trench;
    forming a second charge storage element on said second sidewall of said second trench;
    forming a first source/drain region in the substrate;
    forming an oxide layer extending into and substantially contacting an entire upper surface of an upper region of the first source/drain region;
    forming a first oxide layer on the first sidewall of the first trench, wherein the first oxide layer is formed using thermal oxidation and wherein during the thermal oxidation, the first source/drain region diffuses, forming another source/drain region larger than the source/drain region; and
    forming a charge storage layer on the first oxide layer.

2. The method as recited in claim 1 wherein said forming of said first charge storage element comprises:
    forming a second oxide layer on said charge storage layer.

3. The method as recited in claim 2 wherein said charge storage layer is selected from the group consisting of silicon nitride, silicon rich nitride, polycrystalline silicon, and high-K material.

4. The method as recited in claim 1 further comprising forming a word line in contact with said first charge storage element and said second charge storage element.

5. The method as recited in claim 1 further comprising:
    forming a hard mask over said oxide layer; and
    removing portions of said hard mask corresponding to locations where said first and second trenches are to be formed.

6. The method as recited in claim 1 wherein said first trench has a depth in a range of 100-1000 angstroms.

7. The method as recited in claim 1 further comprising:
forming a second source/drain region in said substrate, said first source/drain region and said second source/drain region formed substantially under said first trench and said second trench in said semiconductor substrate, respectively.

8. The method as recited in claim 1 wherein said forming of said first source/drain region comprises:
forming an offset spacer on said first sidewall of said first trench;
implanting said first source/drain region in said substrate; and
removing said offset spacer.

\* \* \* \* \*